United States Patent [19]

Boyle

[11] Patent Number: 5,683,614
[45] Date of Patent: Nov. 4, 1997

[54] SOL-GEL TYPE SYNTHESIS OF $Bi_2(SR,TA_2)$ $O_9$ USING AN ACETATE BASED SYSTEM

[75] Inventor: Timothy J. Boyle, Albuquerque, N. Mex.

[73] Assignee: Sandia Corporation, Alburquerque, N. Mex.

[21] Appl. No.: 699,075

[22] Filed: Aug. 16, 1996

[51] Int. Cl.[6] .................................................. H01L 41/00
[52] U.S. Cl. ................ 252/62.9 R; 501/12; 501/134; 556/28; 556/31; 556/77; 427/100; 427/126.6; 427/226
[58] Field of Search ................ 252/62.9 R; 501/12, 501/134; 427/100, 126.3, 226; 556/28, 31, 77

[56] References Cited

U.S. PATENT DOCUMENTS 5,468,679  11/1995  Paz de Araujo et al. ............... 437/110

OTHER PUBLICATIONS

Klee et al, "Sol–Gel and MOD Processing of Layered Perovskite and $SrTiO_3$ Films", Microelectr. Engin., vol. 29, Jul. 1995, pp. 185–188.

Amanuma et al, "Structural and Ferroelectric Properties of $SrBi_2Ta_2O_9$ Thin Films", Mat. Res. Soc. Symp. Proc., vol. 361, 1995, pp. 21–5 no month.

Chu et al, "Characteristics of Spin–on Ferroelectric $SrBi_2Ta_2O_9$ Thin Film Capacitors for Ferroelectric Random Access Memory Applications", J. Mater. Res., vol. 11(5), May 1996, pp. 1065–1068.

B. A. Tuttle and R. W. Schwartz, *Solution Deposition of Ferroelectric Thin Films*; Materials Research Society Bulletin, 21(6)49–53 (1996) Jun.

G. H. Haertling, *PLZT Thin Films Prepared from Acetate Precursors*; Ferroelectrics, 116 51–63 (1991) no month.

Kazushi Amanuma, Takashi Hase, and Yoichi Miyasaka, *Structural and Ferroelectric Properties of $SrBi_2Ta_2O_9$ Thin Films*; Mat. Res. Soc. Symp. Proc., vol. 361, pp. 21–25 (1995) no month.

Hitoshi Watanabe, Takashi Mihara, Hiroyuki Yoshimori and Carlos A. Paz de Araujo, *Preparation of Ferroelectric Thin Films of Bismuth Layer Structured Compounds*; Jpn. J. Appl. Phys., vol. 34 (1995) Pt. 1, No. 9B, Sep.

Takashi Mihara, Hiroyuki Yoshimori, Hitoshi Watanabe and Carlos A. Paz de Araujo, *Characteristics of Bismuth Layered $SrBi_2Ta_2O_9$ Thin–Film Capacitors and Comparison with Pb (Zr, Ti)$O_3$*; Jpn. J. Appl. Phys., vol. 34 (1995) pp. 5233–5239, Part 1, No. 9B, Sep. 1995.

C. A–Paz de Araujo, J. D. Cuchiaro, L. D. McMillan, M. C. Scott and J. F. Scott, *Fatigue–Free Ferroelectric Capacitors with Platinum Electrodes*; Nature, vol. 374, pp. 627–629, 13 Apr. 1995.

Guanghua Yi, Zheng Wu, and Michael Sayer, *Preparation of Pb(Zr, Ti)$O_3$ Thin Films by Sol Gel Processing: Electrical, Optical, and Electro–optic Properties*; J. Appl. Phys. 64(5), pp. 2717–2724, 1 Sep. 1988.

*Primary Examiner*—Melissa Bonner
*Attorney, Agent, or Firm*—George H. Libman

[57] ABSTRACT

A method of forming a layered-perovskite bismuth-strontium-tantalum oxide (SBT) ferroelectric material is performed by dissolving a bismuth compound in a first solvent to form a first solution, mixing a strontium compound and a tantalum compound to form a binary mixture, dissolving the binary mixture in a second solvent to form a second solution, mixing the first solution with the second solution to form a SBT precursor solution, evaporating the first and second solvents to form a SBT precursor material and subsequently sintering said SBT precursor material in the presence of oxygen.

9 Claims, 6 Drawing Sheets

SOL-GEL TYPE SYNTHESIS OF $Bi_2(Sr,Ta_2)O_9$ USING AN ACETATE BASED SYSTEM

This invention was made with Government support under Contract No. DE-AC04-94AL85000 awarded by the United States Department of Energy. The Government has certain rights in the invention.

BACKGROUND OF THE INVENTION

The present application is generally directed to a method of making a layered-perovskite bismuth-strontium-tantalum oxide material.

Ferroelectric thin film materials have been increasingly investigated for use in various electronic and electrooptical applications. For example, thin films of lead-zirconate-titanate (PZT) ferroelectric materials have been investigated for use in non-volatile computer memory applications, sensors, capacitors, piezoelectric devices and various communications applications.

The development of ferroelectric thin-film materials may yield important advances in miniaturization of memory devices, higher capacity memory devices, true memory capacity, increased radiation hardness and very fast switching.

However, formation of the desired ferroelectric thin fills typically requires rather extreme temperature processing, which is not always conducive to integration with conventional silicon-wafer processing technologies, due to temperature limitations as to the stability of the underlying silicon wafer and/or structures thereon. In addition, existing PZT-based materials have limitations as to their use in non-volatile memory devices due to severe polarization fatigue with metal electrodes.

Recently, interest has been exhibited in the layered-perovskite phase of $SrBi_2Ta_2O_9$ (SBT) as an alternative to PZT for non-volatile ferroelectric memories, due to its negligible fatigue from polarization switching, low switching voltage, sufficiently large polarization and minimal tendency to imprint (the tendency of one polarization state to become more stable than the opposite state, manifested by a shift of the hysteresis curve along the voltage axis).

One important technique which has successfully produced SBT thin films is the metallorganic decomposition (MOD) process wherein MOD precursor solutions of large soap-like derivatives (e.g. neo-decanonate carboxylic acid) of the starting metals, are utilized as both the ligand and the solvent. A notable advantage of the MOD strategy is that the chemical precursors, once formed and isolated, demonstrate minimal aging effects.

However, formation of the "soap" derivatives involves long reaction times at reflux temperatures and the extent of ligand exchange and in situ-generated reactive species cannot be identified, which inhibits optimization of the precursor solution.

Also, the chemical stability of the MOD-formed precursors is a disadvantage in that such stability limits the ability to "tailor" the properties of the low-reactivity starting compounds through reactions such as chelation, hydrolysis and condensation, thus restricting process flexibility and the ability to control the structural evolution of the thin film microstructures and heat treatment conditions.

For example, high temperatures (800° C.) are required to convert the as-deposited MOD precursors to the desired layered perovskite phase. At such elevated temperatures, the electrode stack of a typical device for the ferroelectric materials exhibits severe instability and sublayer interaction problems. Lowering of the processing temperature is highly desirable to stabilize these interlayers and to reduce electrode interaction problems. The use of "sol-gel" type processes in PZT processing has resulted in many thin films with excellent ferroelectric properties. Sol-gel approaches typically use shorter, commercially available ligands (as compared with the MOD process) such as short-chain carboxylates and/or alkoxides, and lower precursor synthesis temperatures. However, the precursors so-formed are more susceptible to reaction with atmospheric water and must be handled under inert atmospheres, but the reactive nature of these precursor compounds have been shown to directly affect thermal decomposition, crystallization temperatures, and final microstructures. Typical sol-gel processing parameters for PZT-based ferroelectrics are illustrated in "*Solution Deposition of Ferroelectric Thin Films*", B. A. Tuttle and R. W. Schwartz, Materials Research Society Bulletin, 21(6) 49–53 (1996) and "*PLZT Thin Films Prepared from Acetate Precursors*", G. H. Haertling, Ferroelectrics, 116 51–63 (1991).

However, to the present inventor's knowledge, no "sol-gel" type precursor solutions have been reported for production of SBT thin films.

SUMMARY OF THE INVENTION

A first object of the present invention is to develop a low-temperature process for production of SBT precursor materials for ferroelectric thin films.

A second object of the present invention is to develop a low-temperature process for the deposition of layered-perovskite bismuth-strontium-tantalum oxide (SBT) ferroelectric thin films.

One embodiment of the present invention is directed to a method of forming a bismuth-strontium-tantalum oxide (SBT) precursor material, comprising the steps of dissolving a bismuth compound in a first solvent to form a first solution; mixing a strontium compound and a tantalum compound to form a binary mixture; dissolving said binary mixture in a second solvent to form a second solution; mixing said first solution with said second solution to form a SBT precursor solution; and evaporating said first and second solvents to form a SBT precursor material.

Another embodiment of the present invention relates to a method of forming a layered-perovskite bismuth-strontium-tantalum oxide (SBT) ferroelectric material, comprising the steps of dissolving a bismuth compound in a first solvent to form a first solution; mixing a strontium compound and a tantalum compound to form a binary mixture; dissolving said binary mixture in a second solvent to form a second solution; mixing said first solution with said second solution to form a SBT precursor solution; evaporating said first and second solvents to form a SBT precursor material; and sintering said SBT precursor material in the presence of oxygen.

The embodiments of the present invention are essentially modified "sol-gel" type processes, which provide for formation and deposition of thin film ferroelectric SBT materials at lower temperatures and with reduced processing times, relative to conventional MOD processes for deposition of SBT thin films.

BRIEF DESCRIPTION OF THE DRAWINGS

The above and other objects, features and advantages of the present invention will be better understood from the following detailed descriptions taken in conjunction with the accompanying drawings, all of which are given by way of illustration only, and are not limitative of the present invention.

FIGS. 3A and 3B demonstrate fatigue testing results, wherein

DETAILED DESCRIPTION OF THE INVENTION

The following detailed description of the invention is provided to aid those skilled in the art of practicing the present invention. Even so, the following detailed description of the invention should not be construed to unduly limit the present invention, as modifications and variations in the embodiments herein discussed may be made by those of ordinary skill in the art without departing from the spirit or scope of the present invention.

Figure 1:
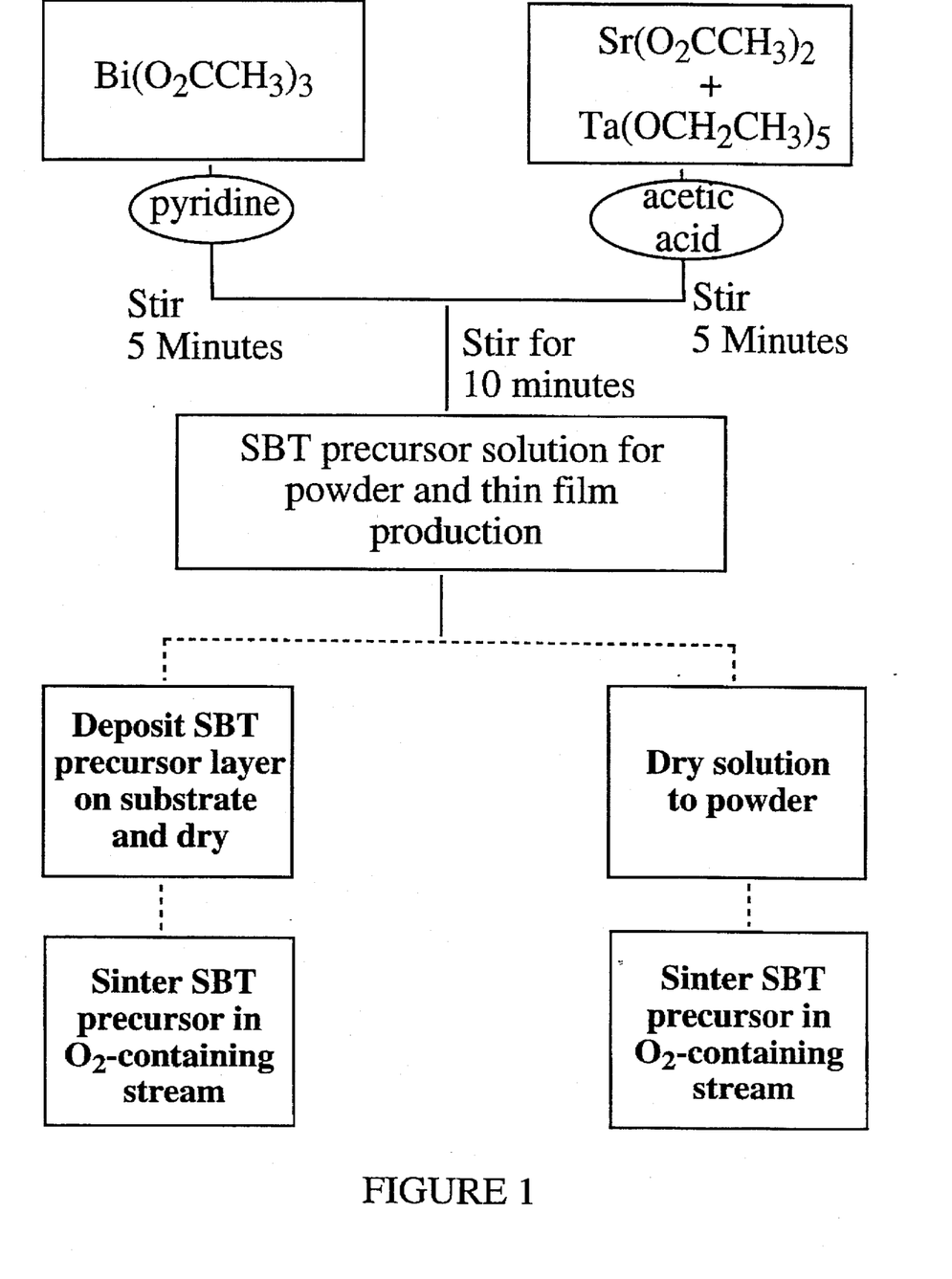
FIG. 1 is a block diagram illustrating the preparation of SBT materials, according to the present invention.

A first embodiment of the present invention, FIG. 1, relates to a method of forming a bismuth-strontium-tantalum oxide (SBT) precursor material, comprising the steps of dissolving a bismuth compound in a first solvent to form a first solution; mixing a strontium compound and a tantalum compound to form a binary mixture; dissolving said binary mixture in a second solvent to form a second solution; mixing said first solution with said second solution to form a SBT precursor solution; and evaporating said first and second solvents to form a SBT oxide precursor material.

According to the first embodiment of the invention the evaporating step is a vacuum distillation, conducted at a pressure of about $1 \times 10^{-3}$ Torr so as to remove all volatile materials, and the SBT precursor material is recovered as a SBT precursor powder.

Another embodiment of the present invention relates to a method of forming a layered-perovskite bismuth-strontium-tantalum oxide (SBT) ferroelectric material, comprising the steps of dissolving a bismuth compound in a first solvent to form a first solution; mixing a strontium compound and a tantalum compound to form a binary mixture; dissolving said binary mixture in a second solvent to form a second solution; mixing said first solution with said second solution to form a SBT precursor solution; evaporating said first and second solvents to form a SBT precursor material; and sintering said SBT precursor material in the presence of oxygen.

FIG. 1 is an illustration of the steps of a preferred embodiment of the present process (with options of the first and second embodiment of the present invention indicated by dashed lines), wherein bismuth acetate is dissolved in pyridine to form a first solution; strontium acetate and tantalum ethoxide are combined and dissolved in acetic acid to form a second solution; and the two solutions are combined and stirred for about 10 minutes to form a SBT precursor solution. Subsequently, the SBT precursor powders may be isolated, or optionally the precursor solutions may be directly coated onto a suitable substrate, dried and sintered in an oxygen-containing atmosphere.

In a further embodiment, the SBT precursor solution may be deposited by spin coating onto a suitable semiconductor substrate, such as a Pt/$SiO_2$/Si wafer to form a SBT precursor layer, and then subjected to the evaporating step. The semiconductor substrate may be CMOS, BiMOS, GaAs or any other form of semiconductor technology.

According to the second embodiment, the evaporating step may be conducted either as a vacuum distillation, discussed above, or the volatile materials may be driven-off by heating the coated substrate on a hot plate at a temperature of about 300° C., and cooling the layered substrate to ambient temperature, so as to form a SBT precursor material layer on the substrate.

Finally, the SBT precursor materials may be converted to layered-perovskite SBT by sintering the SBT precursor material at a rate of 20° C./min from ambient temperature up to a final temperature between 650° C. and 800° C., preferably between 700° C. and 750° C., and maintaining the final temperature for about 30 minutes. The sintering step is conducted under a flowing atmosphere containing oxygen, such as air or preferably oxygen.

According to the above embodiments, the dissolving and mixing steps are conducted under an atmosphere effective to exclude oxygen and moisture, such as argon, nitrogen or helium.

The reactant materials of the present invention are chosen similarly to those of a typical sol-gel process; i.e. the metallo-organic reactants may have either acetate or alkoxide ligands. In the instant process, commercially available reactants of high purity are utilized: A bismuth compound having a $C_1$–$C_5$ carboxylate ligand, preferably bismuth acetate, Bi($O_2CCH_3$)$_3$; a strontium $C_1$–$C_5$ carboxylate, such as strontium acetate, Sr($O_2CCH_3$)$_2$; and a tantalum $C_1$–$C_5$ alkoxide, such as tantalum ethoxide, Ta($OCH_2CH_3$)$_5$.

The commercial availability of the reactant materials of the present invention is a major advantage over the prior art MOD process for preparing layered SBT, wherein the precursor "soap" materials are typically synthesized at high temperatures.

While the above-listed materials are preferred, it is expected that other carboxylates such as formates and propionates, and other alkoxides, such as methoxides and propoxides, would be suitable ligands for the reactant metals. The ligand is chosen so as to minimize the number of carbons present in the precursor materials, and therefore reduce the final processing temperature. In addition, longer carbon chain ligands result in oily reactant compounds, or reduced solubility in the reaction solvents.

The process of the present invention is a two solvent process, wherein the solvents are chosen based on their ability to dissolve the various reactant materials. In the case of the strontium and tantalum compounds, a short-chain is carboxylic acid ($C_1$–$C_5$), such as acetic acid, was found to have sufficient solvating ability. However, the bismuth compound was only slightly soluble in acetic acid. Attempts to develop a single solvent system resulted in precipitation of the starting materials.

Accordingly, it was necessary to select a different solvent to dissolve the bismuth compound. It was found that an amine-containing solvent, such as pyridine or N-methylimidazole, provided sufficient solvating ability for the bismuth compound. However, it is expected that derivatives of carboxylic acids, such as a carboxylate, e.g. an acetate, would also provide suitable solvating power for the strontium and tantalum compounds; and that other amine-containing solvents, such as pyridine, pyrroline, imidazole, aniline and their derivatives, would be useful in dissolving the bismuth compounds.

While the "ideal" stoichiometry of SBT ferroelectric materials is indicated by the formula $SrBi_2Ta_2O_9$, i.e., atomic ratio of Sr/Bi/Ta is 1/2/2, the final stoichiometry of the SBT thin films does not have to be the "ideal" stoichiometry. Excess bismuth may be added in order to compensate for the volatility of bismuth oxide, formed at the upper temperature limit (800° C.) of the sintering temperature range of the present invention. It was found that addition of a slight excess of bismuth acetate yielded significantly sharper perovskite peaks (by grazing incidence X-ray diffraction—GIXRD) and reduced the degree of minor crystalline phases present in the finally processed material.

Alternatively, it has been determined that formulating the materials in a manner such that the Bi and Sr content is somewhat deficient, that is, less than the above-cited ratio, provides an advantage in the ability to sinter the SBT thin films at lower temperatures, while still obtaining acceptable ferroelectric thin films.

Accordingly, in the process of the present invention, the preferred atomic ratios of the metal components in the SBT thin films are obtained by utilizing molar reactant ratios as follows: 1.8–2.0 bismuth compound/1.5–2.0 tantalum compound/0.695–1.0 strontium compound.

PREPARATION EXAMPLES

All compounds described below were handled with rigorous exclusion of air and water using standard Schlenk vacuum line and glove box techniques.

Bismuth acetate ($Bi(O_2CCH_3)_3$, Alfa 99.999%), strontium acetate ($Sr(O_2CCH_3)_2$, Alfa 99.999%) and tantalum ethoxide ($Ta(OCH_2CH_3)_5$, Alfa 99.999%) were used as received. The two solvents, acetic acid ($CH_3CO_2H$, Aldrich) and pyridine (Aldrich), were both dried over acetic anhydride/$CrO_3$ and $CaH_2$ and/or CaO, respectively and freshly distilled prior to use.

Example A

SBT Precursor Solution

A first solution was synthesized by dissolving $Bi(O_2CCH_3)_3$ (0.965 g, 2.50 mmol) in a flask with pyridine (1.25 mL) with stirring. In a second flask, $Ta(OCH_2CH_3)_5$ (0.768 g, 1.89 mmol) was added to $Sr(O_2CCH_3)_2$ (0.179 g, 0.87 mmol), followed by addition of acetic acid (3.63 mL) via pipette to form a second solution. Both solutions were allowed to stir for 10 minutes, or until dissolution was complete, and then were combined.

The ternary mixture, SBT precursor solution so-formed was stirred for another 10 minutes before initiating SBT powder and/or film production.

Example 1

SBT Precursor Powder

According to the first embodiment of the present invention, the SBT precursor solution formed in Example A was subjected to vacuum distillation under a vacuum of about $1 \times 10^{-3}$ Torr, to isolate SBT precursor powders.

Example 2

SBT Thin Films

According to the second embodiment of the present invention, the SBT precursor solution of Example A was removed from the glove box and films were produced by spin coat deposition of the precursor solution as a 0.4M gel, in air, onto a Pt/$SiO_2$/Si wafer, at 3000 rpm for 30 seconds. The coated wafer was then treated on a hot plate at 300° C. for 5 minutes. The wafer was placed in a tube furnace under an oxygen atmosphere, and was heated to 750° C. at 20° C./min, with the final temperature held for about 10 minutes, to sinter the SBT precursor layer and form the layered-perovskite SBT thin film. The SBT precursor powders may be sintered in a similar manner. After cooling to ambient temperature, the spin coat deposition and the heat-treatment processes were conducted five times, to form a multi-layered SBT precursor-coated wafer, wherein the SBT layer was about 5000 Å thick.

Examples 3–6

Additional examples were formulated according to Example A, above, but varying stoichiometries, and coated as 0.25M gels, to obtain lowered final sintering temperatures (°C.), as indicated in Table 1, below.

TABLE 1

| Component/Temp | 800 | 700–800 | 650 |
|---|---|---|---|
| Bi | 2.0 | 2.0 | 1.8 |
| Ta | 2.0 | 1.513 | 1.513 |
| Sr | 0.98 | 0.695 | 0.695 |

Example 7

Formation and Testing of a Capacitor having an SBT Dielectric Layer

The SBT thin film coated wafer of Example 2, comprising 5 layers of the SBT layered-perovskite film, approximately 5000 Å thick, was provided with top platinum electrodes, which were deposited using a shadow mask, yielding dots of approximately 150 mm in diameter.

The ferroelectric properties of the SBT films were measured using an RT66A ferroelectric tester from Radiant Technologies. The dielectric properties were measured using an HP 4194A impedance analyzer. Fatigue tests were performed using a 25 kHz sinusoidally varying voltage with a 6 Volt amplitude. Imprint tests were carried out by first poling the capacitor to a positive or negative remanent polarization state ($+P_r$ or $-P_r$) and then heating the sample to 140° C. for 45 minutes. GIXRD studies showed that the film was pure layered-perovskite (SBT).

Figure 2:
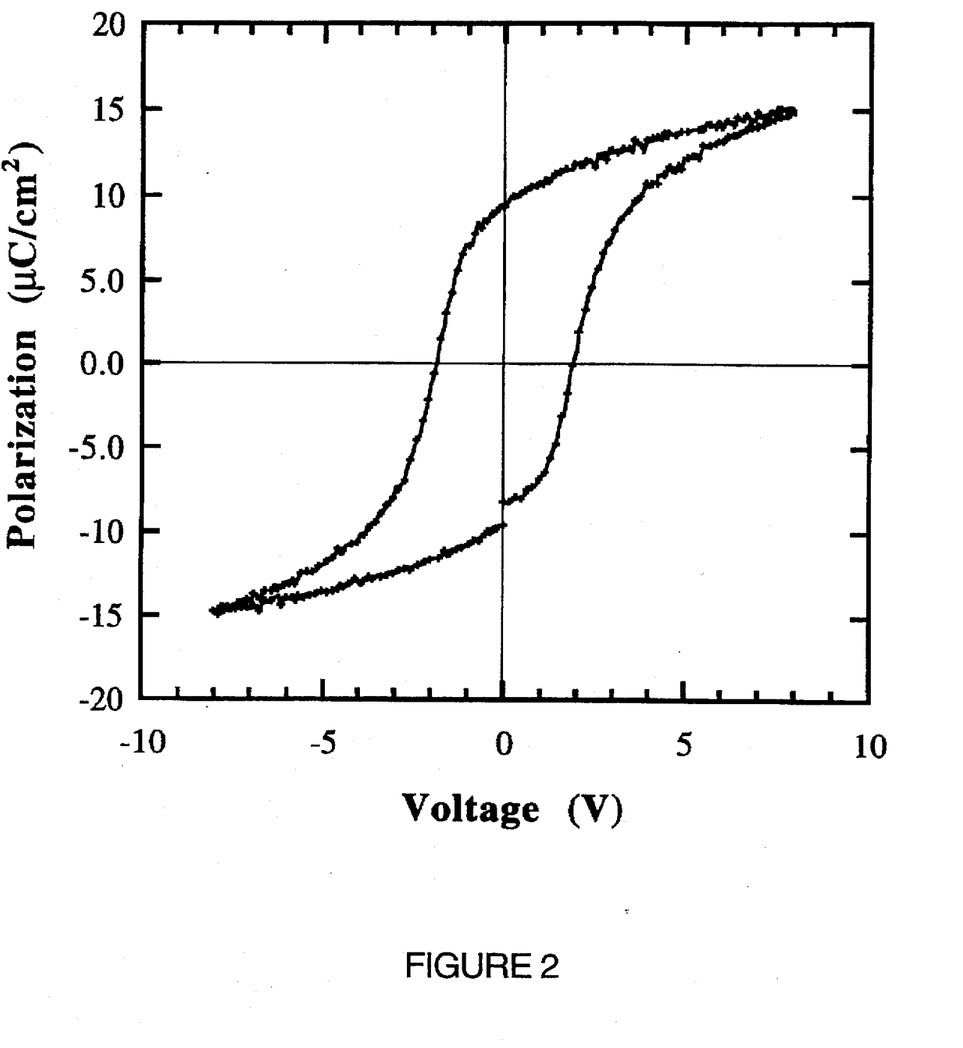
FIG. 2 is a hysteresis curve of a standard stoichiometry SBT film, sintered at 700° C.

FIG. 2 is a graphic demonstration of the hysteresis loop of the Pt//SBT//Pt capacitor, made according to Example 7. Typical properties of the inventive SBT films include a remanant polarization of 7–10 mC/cm$^2$, a coercive voltage of 45 kV/cm and a film resistivity of about $1 \times 10^{10}$ W-cm. Unlike the PZT systems, the SBT films are fatigue-free (up to $4 \times 10^9$ switching cycles), even when Pt electrodes are used, as demonstrated in FIG. 3A and 3B. In fact, the difference between the switched and unswitched polarization of the inventive SBT films dropped by less than 3% after $4 \times 10^9$ cycles, consistent with previously reported SBT films.

Figure 3A:
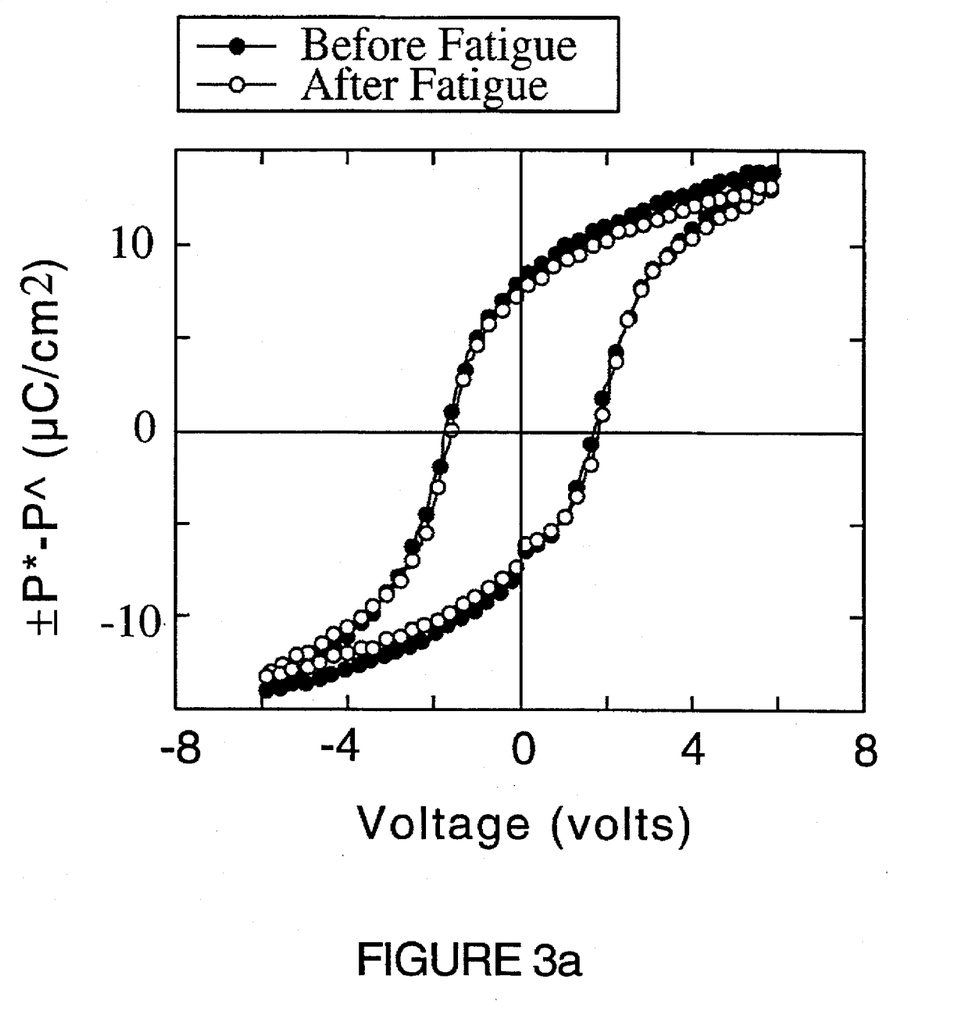
FIG. 3A represents hysteresis curves before and after fatigue testing and FIG. 3B is a plot of polarization vs. number of cycles.
Figure 3B:
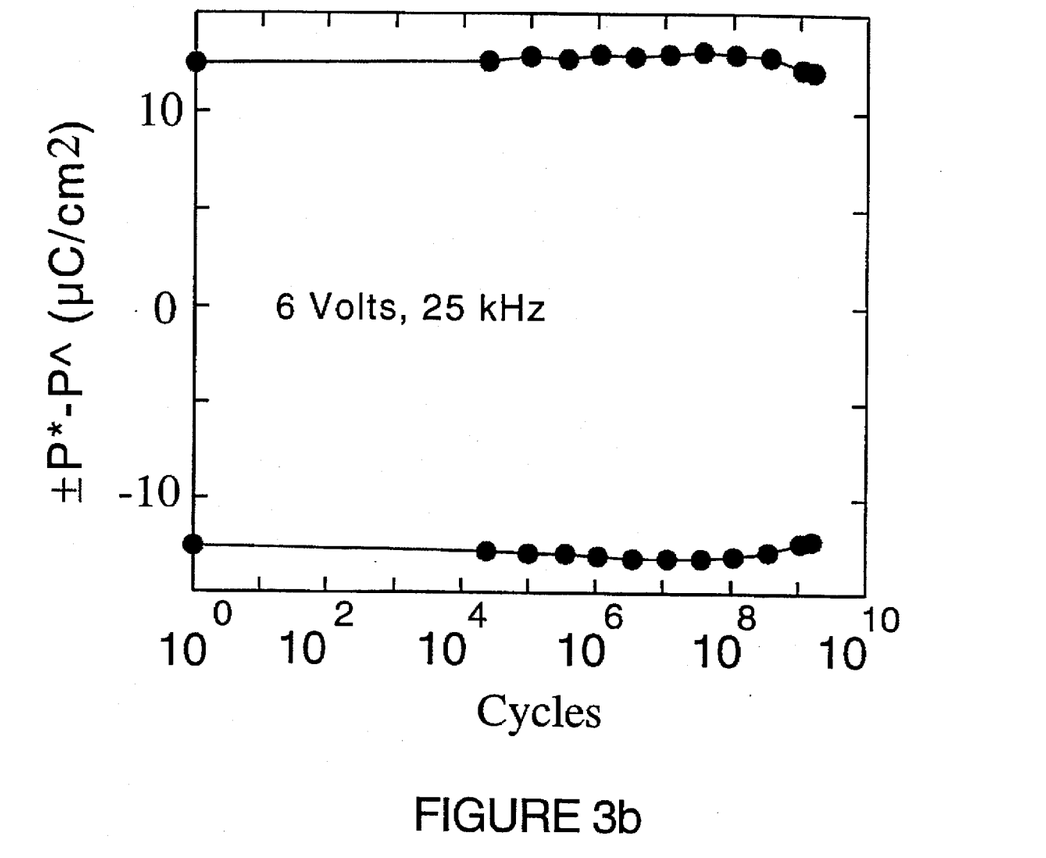

The hysteresis loops of FIGS. 3A and 3B demonstrate the ferroelectric properties of the Example 7 Pt//SBT//Pt capacitor, both before and after $5 \times 10^9$ polarization cycles.

Figure 4A:
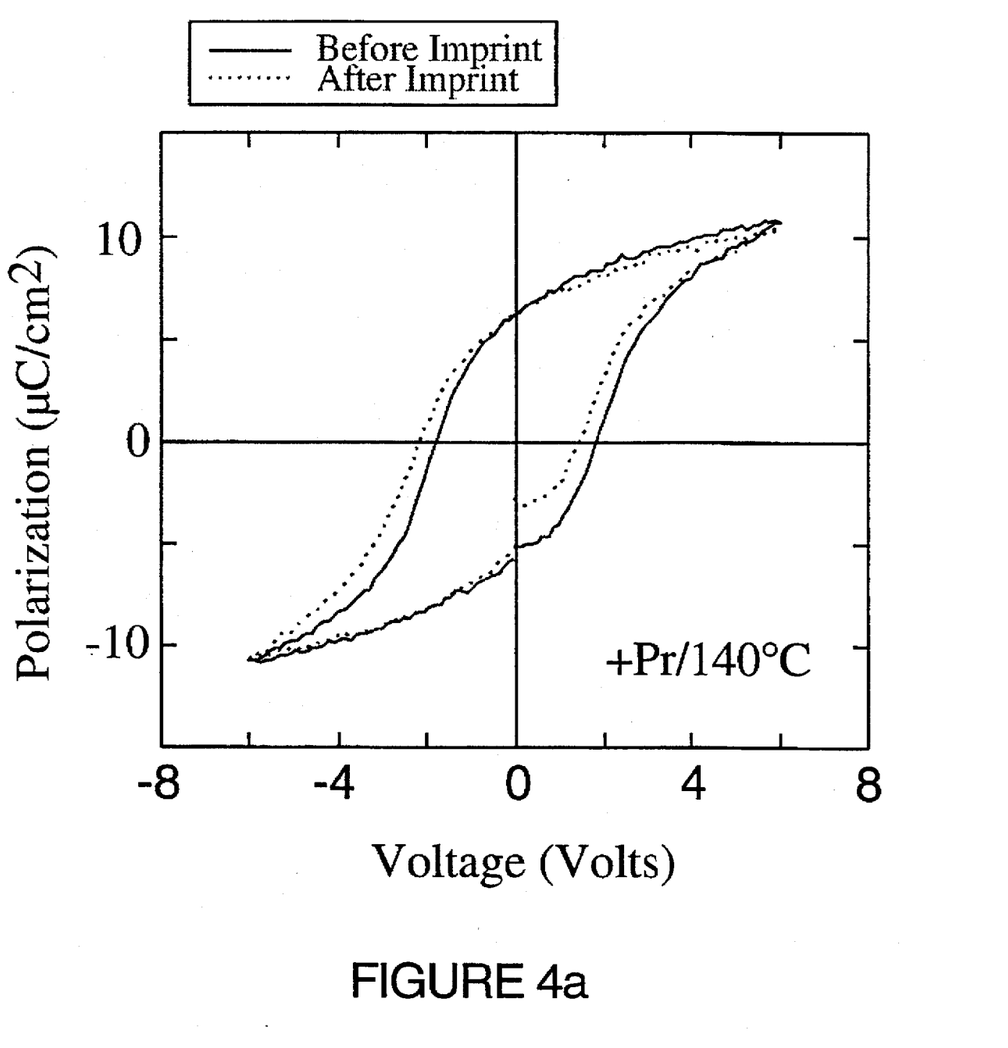
FIGS. 4A and 4B are hysteresis curves demonstrating imprint testing results at 140° C.: (4A) +$P_r$ and (4B) –$P_r$.
Figure 4B:
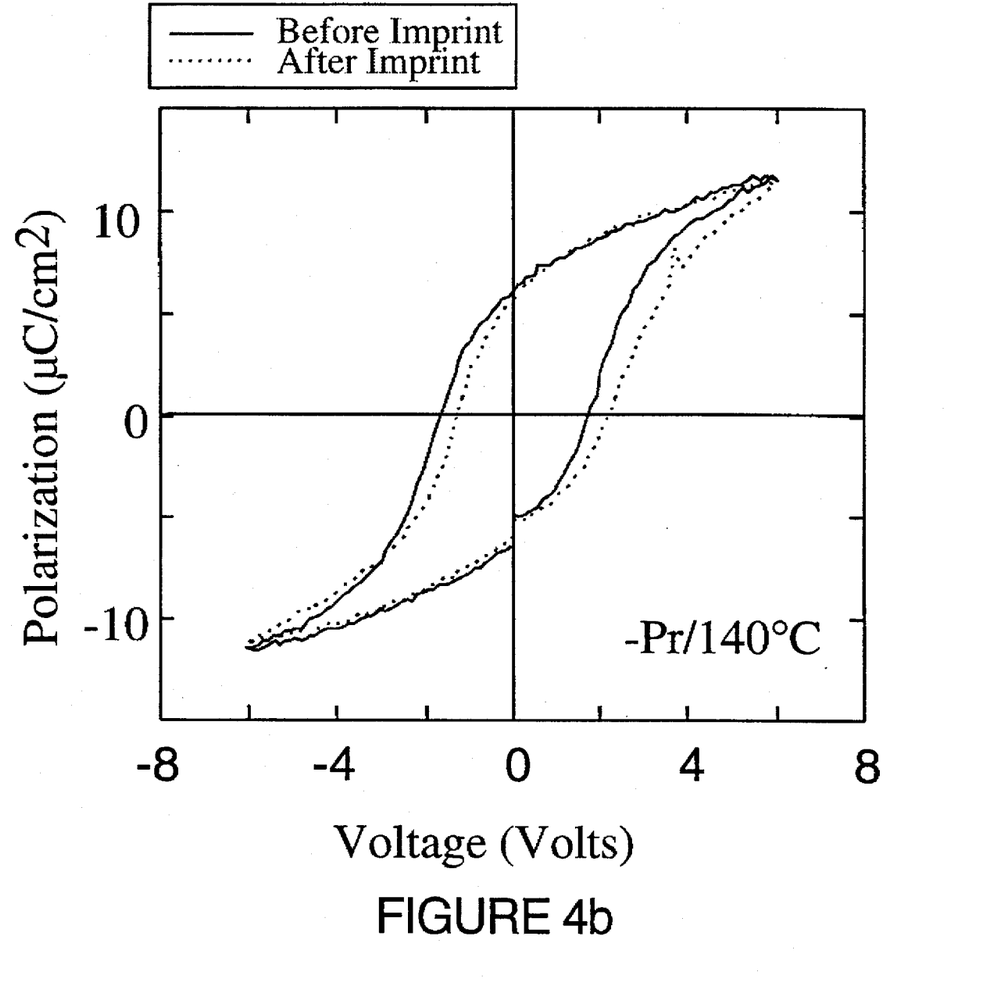

FIGS. 4A and 4B illustrate the results of an imprint test performed on capacitors, containing SBT films made by the inventive process, poled in either the $+P_r$ (FIG. 4A) or $-P_r$ (FIG. 4B) state, followed by heating to 140° C. for 45 minutes. The average voltage shifts were 0.37 and 0.46 V for the capacitors poled to $+P_r$ and $-P_r$, respectively. These shifts correspond to the average change in the positive and negative coercive voltages of the capacitor. The shifts are roughly 23% of the coercive voltage, suggesting that even though this material may imprint, imprint failure was not observed under these test conditions. The average dielectric constant (e) of the inventive 5000 Å Pt//SBT//Pt capacitors is about 380, with a tan d of about 0.03.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming a bismuth-strontium-tantalum oxide (SBT) precursor material, comprising the steps of:

dissolving a bismuth compound having a $C_1$–$C_5$ carboxylate ligand in a first solvent to form a first solution;

mixing a strontium $C_1$–$C_5$ carboxylate compound and a tantalum $C_1$–$C_5$ alkoxide compound to form a binary mixture;

dissolving said binary mixture in a second solvent to form a second solution;

mixing said first solution with said second solution to form a SBT precursor solution; and evaporating said first and second solvents to form a SBT precursor material.

2. The method according to claim 1, wherein said bismuth compound is bismuth acetate and said first solvent is an amine solvent.

3. The method according to claim 2, wherein said amine solvent is pyridine.

4. The method according to claim 1, wherein said strontium compound is strontium acetate, said tantalum compound is tantalum ethoxide and said second solvent is acetic acid.

5. A method of forming a layered-perovskite bismuth-strontium-tantalum oxide (SBT) ferroelectric material, comprising the steps of:

dissolving a bismuth compound having a $C_1$–$C_5$ carboxylate ligand in a first solvent to form a first solution;

mixing a strontium $C_1$–$C_5$ carboxylate compound and a tantalum $C_1$–$C_5$ alkoxide compound to form a binary mixture;

dissolving said binary mixture in a second solvent to form a second solution;

mixing said first solution with said second solution to form a SBT precursor solution;

evaporating said first and second solvents to form a SBT precursor material; and sintering said SBT precursor in the presence of oxygen.

6. The method according to claim 5, wherein said bismuth compound is bismuth acetate and said first solvent is an amine solvent.

7. The method according to claim 6, wherein said amine solvent is pyridine.

8. The method according to claim 5, wherein said strontium compound is strontium acetate, said tantalum compound is tantalum ethoxide and said second solvent is acetic acid.

9. A method of forming a layered-perovskite bismuth-strontium-tantalum oxide (SBT) ferroelectric material, comprising the steps of:

dissolving bismuth acetate in pyridine to form a first solution;

mixing strontium acetate and tantalum ethoxide to form a binary mixture;

dissolving said binary mixture in acetic acid to form a second solution;

mixing said first solution with said second solution to form a SBT precursor solution;

depositing a thin coating of said SBT precursor solution on a substrate;

evaporating said first and second solvents to form a SBT precursor material layer; and sintering said SBT precursor material in the presence of oxygen.

\* \* \* \* \*